United States Patent
Angelini et al.

(10) Patent No.: US 10,942,228 B2
(45) Date of Patent: Mar. 9, 2021

(54) TEMPERATURE COMPENSATION CIRCUIT, CORRESPONDING DEVICE AND METHOD

(71) Applicant: STMicroelectronics S.r.l., Agrate Brianza (IT)

(72) Inventors: Paolo Angelini, Bologna (IT); Roberto Pio Baorda, Milan (IT); Danilo Karim Kaddouri, Pero (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 138 days.

(21) Appl. No.: 16/013,559

(22) Filed: Jun. 20, 2018

(65) Prior Publication Data

US 2018/0372811 A1    Dec. 27, 2018

(30) Foreign Application Priority Data

Jun. 26, 2017    (IT) .................. 102017000071189

(51) Int. Cl.

| | |
|---|---|
| *G01R 33/00* | (2006.01) |
| *H01L 27/22* | (2006.01) |
| *G01R 33/07* | (2006.01) |
| *H01L 43/04* | (2006.01) |
| *H01L 43/06* | (2006.01) |
| *H03G 3/30* | (2006.01) |

(52) U.S. Cl.

CPC ..... *G01R 33/0082* (2013.01); *G01R 33/0029* (2013.01); *G01R 33/07* (2013.01); *H01L 27/22* (2013.01); *H01L 43/04* (2013.01); *H01L 43/065* (2013.01); *H03G 3/30* (2013.01); *H03G 2201/708* (2013.01)

(58) Field of Classification Search

CPC ....... H01L 43/04; H01L 43/065; H01L 23/34; H01L 27/22; G01R 33/0082; G01R 33/07; G01R 33/0029; G01R 33/072; G01R 33/077; G01R 15/202; G01R 19/32; G01R 33/0041; G01R 33/0052; G01R 33/0035; G01R 33/0094; G01R 35/005; H03G 2201/708; H03G 3/30; G01D 5/145; G01D 5/2448; G01L 1/26; G05F 3/225

See application file for complete search history.

(56) References Cited

U.S. PATENT DOCUMENTS

| | | | |
|---|---|---|---|
| 4,833,406 A | 5/1989 | Foster | |
| 6,104,231 A * | 8/2000 | Kirkpatrick, II | ....... G01R 33/07 327/378 |
| 8,604,777 B2 * | 12/2013 | Doogue | ............... G01R 15/148 324/202 |

(Continued)

FOREIGN PATENT DOCUMENTS

EP    0450910 A2    4/1991

OTHER PUBLICATIONS

IT Search Report and Written Opinion for IT Appl. No. 2017000071189 dated Mar. 5, 2018 (9 pages).

(Continued)

*Primary Examiner* — Vinh P Nguyen

(74) *Attorney, Agent, or Firm* — Crowe & Dunlevy

(57) ABSTRACT

A compensation circuit receives a sensing signal from a Hall sensor and outputs a compensated Hall sensing signal. The compensation circuit has a gain that is inversely proportional to Hall sensor drift mobility. The compensated Hall sensing signal is temperature-compensated.

31 Claims, 2 Drawing Sheets

(56) References Cited

U.S. PATENT DOCUMENTS

| | | | |
|---|---|---|---|
| 9,864,038 B2* | 1/2018 | Fujita | G01R 33/07 |
| 10,162,017 B2* | 12/2018 | Cesaretti | G01R 33/07 |
| 10,345,394 B2* | 7/2019 | Raman | G01R 33/0029 |
| 2014/0103921 A1 | 4/2014 | Raman et al. | |
| 2015/0115937 A1 | 4/2015 | Fujita et al. | |
| 2016/0356862 A1 | 12/2016 | Ariyama | |
| 2018/0017637 A1 | 1/2018 | Cesaretti | |
| 2019/0107584 A1* | 4/2019 | Baorda | G01R 33/07 |
| 2019/0113550 A1* | 4/2019 | Hong | G01R 15/202 |

OTHER PUBLICATIONS

Marc Pastre et al: "A Hall Sensor Analog Front End for Current Measurement With Continuous Gain Calibration", IEEE Sensors Journal, IEEE Service Center, New York, NY, US, vol. 7, No. 5, May 1, 2007, pp. 860-867.

\* cited by examiner

TEMPERATURE COMPENSATION CIRCUIT, CORRESPONDING DEVICE AND METHOD

PRIORITY CLAIM

This application claims the priority benefit of Italian Application for Patent No. 102017000071189, filed on Jun. 26, 2017, the content of which is hereby incorporated by reference in its entirety to the maximum extent allowable by law.

TECHNICAL FIELD

The description relates to temperature compensation in electronic circuits.

One or more embodiments may be applied to temperature compensation of Hall sensors.

BACKGROUND

Sensitivity of Hall sensors may be strongly dependent on temperature.

An approach for compensating such a dependency may involve producing a variation in the Hall sensor resistance and a re-distribution of a supply current between the Hall sensor and a shunt resistor. This makes it possible to vary the input current $I_{in}$ to the sensor thereby compensating a change in Hall sensitivity.

Such an approach has a drawback in that it relies on an expectedly linear temperature behavior of the sensitivity of the Hall element, which represents only an approximate model of the real behavior.

In the presence of a large bias current to the sensor, the temperature dependency may become strongly non-linear. Consequently, the approach discussed in the foregoing lends itself to be applied only to relatively small bias currents, which is hardly compatible with low-noise applications.

Also, the approach discussed in the foregoing assumes a linear temperature behavior of the shunt resistor which, again, only represents an approximate module of the real behavior.

Furthermore, the shunt resistor leads to extra current consumption in addition to the consumption of the Hall sensor and may be sensitive to process variations with a compensation resistor unable to properly track the Hall sensor parameters.

There is a need in the art to overcome the drawbacks discussed in the foregoing.

SUMMARY

One or more embodiments facilitate compensation for Hall sensitivity temperature drift by using a variable gain capable of tracking sensitivity drift in the Hall element.

One or more embodiments use a Hall-type element in a feedback loop in order to simulate the resistance behavior of the Hall sensor with respect to temperature.

In one or more embodiments, the resistance of such a Hall-type element may be changed correspondingly in order to compensate the residual temperature dependence due to drift mobility.

One or more embodiments may provide a fully differential architecture adapted to be associated with a Hall sensor element in order to compensate the sensitive temperature drift thereof.

One or more embodiments may provide a compensation circuit capable of tracking Hall sensor corner variations without requiring process corner calibration.

One or more embodiments may provide a compensation circuit adapted to operate independently of the bias voltage applied to the Hall sensor.

One or more embodiments may rely on the thickness of a compensation element which is a function of the P-well voltage of the sensor.

In one or more embodiments, a change may be provided in the depletion region in the N-well causing a change of the equivalent thickness t which affects the Hall plate resistance value.

In one or more embodiments, residual temperature dependence can be effectively compensated.

In one or more embodiments, the compensation element may include a device formed in the same epitaxial layer of semiconductor material where the Hall element is formed.

One or more embodiments may provide high temperature stability and high accuracy.

One or more embodiments may provide Hall signal amplification while performing compensation of the dependency of sensitivity on temperature.

In an embodiment, a circuit comprises: an input port configured for receiving a sensing signal from a Hall; an output port configured for providing a compensated Hall sensing signal; a compensation circuit coupled between the input port and the output port, the compensation circuit having a gain inversely proportional to Hall sensor drift mobility, wherein a compensated sensing signal is temperature-compensated.

One or more embodiments may include a gain control input configured for receiving a temperature-dependent control signal, the gain of the compensation circuit controllable as a function of the control signal at the gain control input with said gain inversely proportional to the ratio of the Hall sensor mobility to the Hall sensor drift mobility.

In one or more embodiments the compensation circuit may include at least one gain-setting resistive element having a resistance value inversely proportional to Hall sensor drift mobility.

In one or more embodiments, the resistive element may include a resistance control input configured for receiving said temperature-dependent control signal, the resistance value of the resistive element controllable as a function of the control signal at the resistance control input.

In one or more embodiments, the resistive element may include a depletion region in a first semiconductor well formed in a semiconductor well of opposed polarity.

In one or more embodiments, the control signal at the resistance control input may be active on the thickness of said depletion region in said first well.

In one or more embodiments, the resistive element may include a Hall element.

One or more embodiments may include an amplifier circuit between the input port and the compensation circuit.

In one or more embodiments:
the input port may be configured for receiving a differential sensing signal from a Hall sensor,
the compensation circuit may include a differential circuit including a pair of gain-setting loops wherein the output port includes two output nodes each coupled to a respective one of the gain-setting loops, with the compensated sensing signal provided between the two output nodes.

In one or more embodiments, a device may include:
a Hall sensor providing a Hall sensing signal,
a circuit according to one or more embodiments, the circuit having the input port coupled to the Hall sensor to receive the sensing signal from the Hall sensor.

In one or more embodiments, the Hall sensor may be formed in an epitaxial layer of semiconductor material, wherein the compensation circuit includes at least one gain-setting resistive element formed in the same epitaxial layer of the Hall element.

In one or more embodiments, a method comprises: receiving a sensing signal from a Hall sensor at an input port; providing a compensated Hall sensing signal at an output port; applying between the input port and the output porta compensation gain inversely proportional to Hall sensor drift mobility, wherein the compensated sensing signal is temperature-compensated.

The method further comprises: receiving a temperature-dependent compensation gain control signal; and controlling the compensation gain as a function of the control signal by keeping the compensation gain inversely proportional to the ratio, of the Hall sensor mobility to the Hall sensor drift mobility.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments are based on the recognition that sensitivity S of Hall sensors may be expressed as:

$$S \stackrel{def}{=} \frac{V_h}{B_z} = \frac{r_n}{qtN_D} G_T I$$

where:
$V_h$=Hall output voltage,
$B_z$=Magnetic field perpendicular to the plane of the sensor,
q=Electron charge,
$N_D$=N-type carrier density in the Hall element,
t=Thickness of the Hall element; this is a function of the P-well voltage,
$G_T$=Hall element geometry factor,
$r_n$=defined as the ratio where $\mu'_n/\mu_n$, is the drift mobility and $\mu'_n$ is the Hall mobility, and
I=Current in the Hall element.

The resistivity $R_{hall}$ of a Hall sensor can be written as $$R_{hall} = \frac{\rho}{t} \frac{L}{W}$$

where: W, L, t are geometrical parameters (width, length and thickness of the Hall element) and p is the Hall resistance resistivity, given by:

$$\rho = 1/qN_D\mu_n.$$

Consequently the Hall sensitivity may also be expressed (as a function of the bias voltage $V_{bias}$) as:

$$S=\mu'_n G_T V_{bias}(W/L).$$

Hall mobility is related to drift mobility; consequently the sensitivity S exhibits a strong dependency on temperature.

Figure 1:
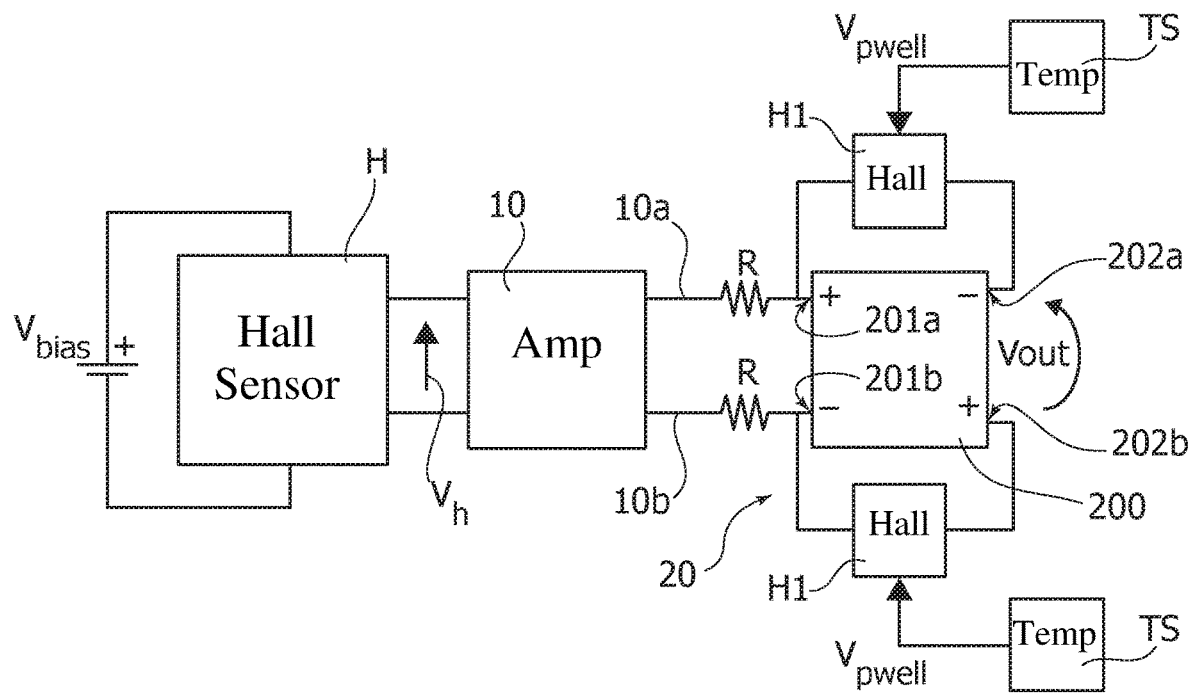
FIG. 1 is a block diagram exemplary of a temperature compensation arrangement for a Hall sensor.
Figure 2:
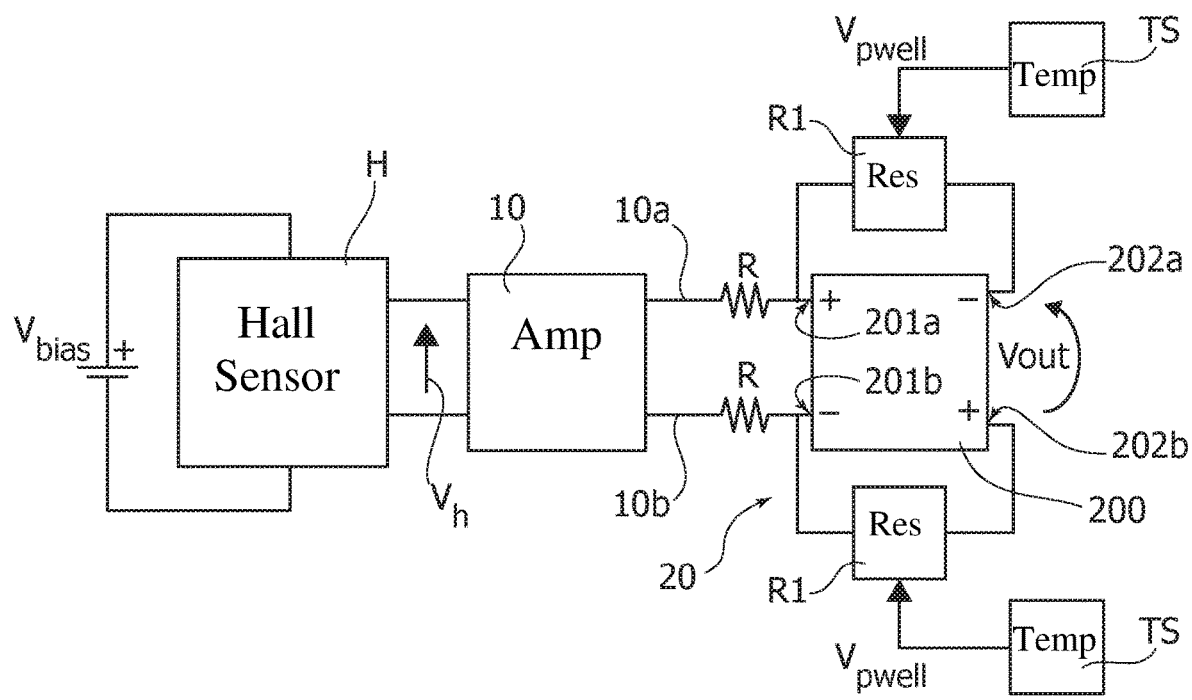
FIG. 2 is a block diagram exemplary of a temperature compensation arrangement for a Hall sensor.

In FIGS. 1 and 2, reference H indicates a Hall sensor (Hall element) to which a bias voltage $V_{bias}$ is applied.

In one or more embodiments, the Hall element H may be of any known type providing a (differential) output voltage $V_h$ which, in an embodiment as exemplified herein, is applied to a (differential) amplifier circuit (Amp) 10 whose outputs 10a, 10b are coupled to corresponding inputs of a compensation circuit block indicated as a whole as reference 20.

In one or more embodiments as exemplified herein, the circuit block 20 may include a differential circuit 200 which may be regarded essentially as an (analog) inverting stage including a pair of inputs 201a (non-inverting) and 201b (inverting), and a pair outputs 202a (inverting) and 202b (non-inverting).

For instance, the circuit 200 may include a fully differential opamp, with the inputs 201a, 201b maintained at the same level by feedback and a differential voltage across the outputs 202a e 202b equal to V10 (differential voltage between 10a e 10b) multiplied by RH1/R (where RH1 is the resistance value of H1).

Also, in one or more embodiments as exemplified herein, the circuit block 20 includes a feedback arrangement where:

the signal at the output 202a is coupled via a first feedback element H1 to the input 201a, which in turn is coupled to the output 10a of the amplifier 10 via a resistor of a resistance value R;

the signal at the output 202b is coupled via a second feedback element H1 to the input 201b which in turn is coupled to the output 10b of the amplifier 10 via a resistor of a resistance value R.

As discussed previously, a Hall sensor such as the sensor H may have a sensitivity which is dependent on temperature based on a relationship such as:

$$S = \frac{V_h}{B_z} = \frac{r_n}{qtN_D} G_T I = \mu'_n G_T V_{bias} \frac{W}{L}$$

One or more embodiments may rely on the provision of (Hall-type) feedback elements H1 exhibiting a resistance value $R_{Hall1}$ which may be expressed as:

$$R_{Hall1} = \frac{1}{qN_D\mu_n}\frac{L}{Wt_1}$$

where:

$\mu_n$ is the drift mobility, and

W, L, $t_1$ are geometrical parameters (width, length and thickness of the feedback elements H1).

By elementary circuit considerations, the output voltage $V_{out}$ from an arrangement as exemplified in FIG. 1 can be expressed as:

$$V_{out} = \mu'_n G_T V_{bias}\frac{W}{L}A1\frac{R_{Hall1}}{R}B = \mu'_n G_T V_{bias}\frac{W}{L}A1\frac{1}{R}\frac{L}{qN_D\mu_n Wt_1}B$$

that is:

$$V_{out} = V_{bias}A1 r_n \frac{1}{qN_D t_1 R}B, V_{bias}A1 r_n \frac{1}{qN_D t_1 R}B$$

where A1 denotes the voltage gain of the amplifier circuit 10.

Stated otherwise, by providing a gain-setting (for example feedback) component H1 (and R1 in FIG. 2, to be discussed later) wherein the relationship $$R_{Hall1} = \frac{1}{qN_D\mu_n}\frac{L}{Wt_1}$$

applies, the sensitivity drift due to $\mu_n$ can be compensated (independently from any process corner) by taking advantage of the fact that $R_{Hall1}$ will be affected by the same parameter changes affecting the Hall element H.

In one or more embodiments, the compensation circuit 20 may thus have a gain inversely proportional to Hall sensor drift mobility, $\mu_n$, so that the compensated sensing signal $V_{out}$ is temperature-compensated.

It was observed that the parameter $t_1$ may be quite stable with respect to temperature due to the fact that the element H1 may have a small voltage drop (for example much smaller than the voltage drop at H).

It was similarly observed that, in an arrangement as exemplified in FIG. 1 (and FIG. 2), $V_{out}$ may still exhibit a temperature dependence due to $r_n$. By way of example this may be for example of the order of +/−3% by considering an operating range between −40° and +150°.

In one or more embodiments the possibility is thus contemplated of making the resistance value of the elements H1 (and R1 in FIG. 2, to be discussed later) dependent on temperature.

Figure 3:
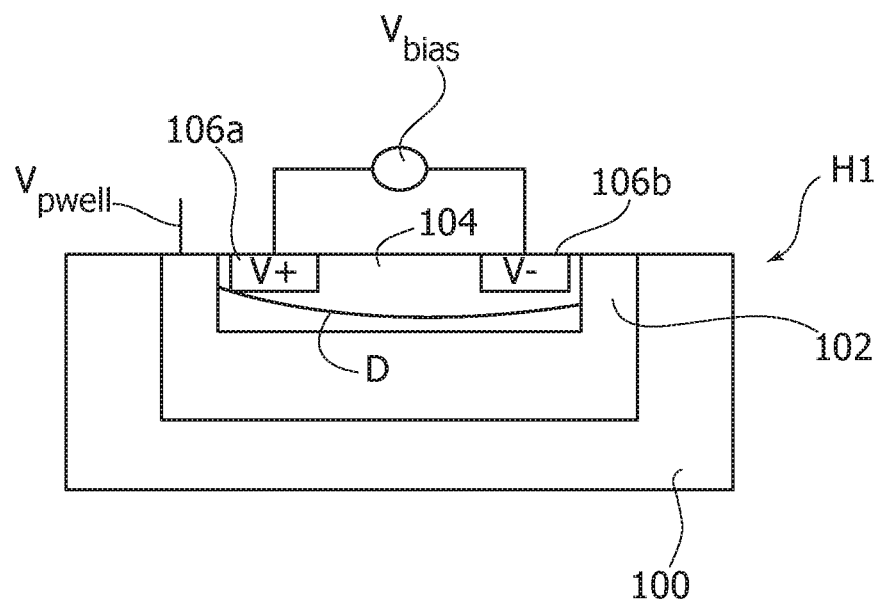
FIGS. 3 and 4 are exemplary of possible details of implementation of embodiments.

FIG. 3 is exemplary of an arrangement wherein a Hall element H1 is shown including an isolating substrate (for instance a N isolating substrate, Niso) 100 in which a P-well 102 is provided in turn hosting a N-well 104 wherein V+ and V− nodes 106a, 106b may be formed across which a bias voltage $V_{bias}$ is applied.

The line D in FIG. 3 is schematically exemplary of the thickness of the depletion region which may be varied by acting on a voltage $V_{pwell}$ applied to the P-well 102.

By varying the voltage $V_{pwell}$, a change in the depletion region in the N-well 104 may occur causing a change of the equivalent thickness t which affects the Hall plate resistance value.

By controlling the voltage $V_{pwell}$ (for example via a temperature sensor circuit (Temp) TS which may be already present in the arrangement) the possibility exists of changing the resistance of the element H1 thus causing the following relationship to apply:

$$V_{out} = \mu'_n G_T V_{bias}\frac{W}{L}A1\frac{R_{Hall1}}{R}B = \mu'_n G_T V_{bias}\frac{W}{L}A1\frac{1}{R}\frac{L}{qN_D\mu_n Wt_1}B$$

that is:

$$V_{out} = V_{bias}A1 r_n \frac{1}{qN_D t_1(V_{pwell})R}B$$

with $r_n$ defined as the ratio $\mu'_n/\mu_n$.

This makes it possible to compensate (also) the residual temperature dependence due to $r_n$, by having the gain of the compensation circuit 20 controllable as a function of the control signal $V_{pwell}$ with said gain inversely proportional to the ratio, $r_n$, of the Hall sensor mobility, $\mu'_n$, to the Hall sensor drift mobility $\mu_n$.

Figure 4:
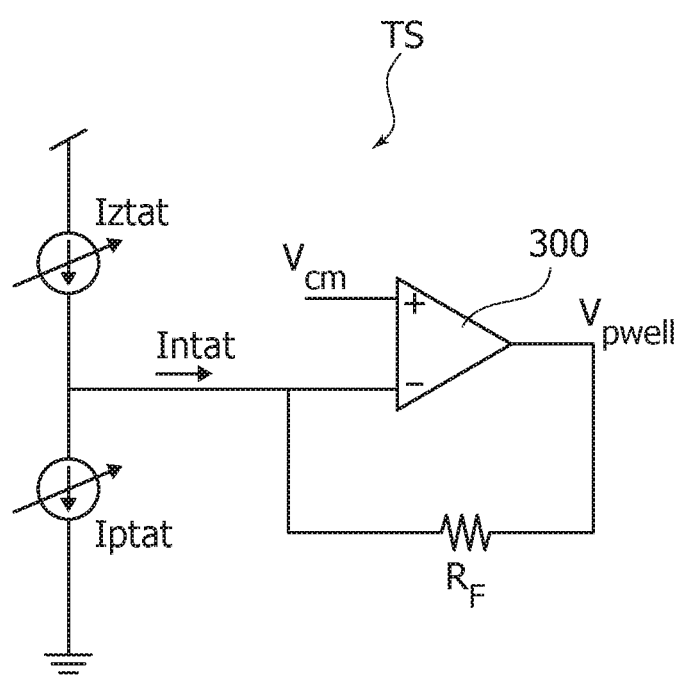

FIG. 4 is exemplary of a possible embodiment of a temperature sensor circuit TS adapted to provide a control voltage $V_{pwell}$ having a positive temperature (linear) coefficient and which is programmable in order to match the temperature dependence of the term $r_n$ in the relationships above.

In an embodiment as exemplified in FIG. 4, the voltage $V_{pwell}$ can be generated starting from two programmable current generators, one with positive temperature coefficient, namely $I_{ptat}$, and one with zero temperature coefficient, namely $I_{ztat}$, which are circuit blocks commonly available for example in an application specific integrated circuit (ASIC).

In an embodiment as exemplified in FIG. 4, the $I_{ptat}$ current is subtracted from the $I_{ztat}$ current, in order to generate the current $I_{ntat}$ which has a negative temperature coefficient. This current is injected into the virtual ground of an operational amplifier 300 with a feedback resistance $R_F$. At the output of the operational amplifier 300 voltage will be present equal to $(V_{cm}-I_{ntat}*R)$ which can be used as $V_{pwell}$ voltage. The temperature coefficient of the $V_{pwell}$ voltage can be adjusted programming the $I_{ztat}$ and $I_{ptat}$ current generators.

While a Hall element H1 essentially similar to the Hall element H has been considered in the foregoing with reference to FIG. 1, in one or more embodiments as exemplified in FIG. 2, a resistive element (Res) R1 (not necessarily in the form of a Hall element) can be used in the feedback loop(s) around the circuit 200 provided such a resistive element R1 may exhibit the same type of dependency of their resistive value $R_X$ on mobility thus making the following relationship applicable:

$$V_{out} = \mu'_n G_T V_{bias}\frac{W}{L}A1\frac{R_X}{R}B$$

The foregoing may also include the possibility of controlling such a resistance value as a function of temperature dependent signal $V_{pwell}$. For instance, resistive elements formed in the same epitaxial layer of semiconductor material in which the Hall element H is formed (namely corresponding to the layout exemplified in FIG. 3) may also be used in one or more embodiments.

One or more embodiments thus make it possible to provide a for example fully differential architecture to read Hall sensor element and compensate its sensitivity temperature drift.

One or more embodiments make it possible to provide a compensation adapted to track Hall sensor corner variations without requiring process corner calibration.

The compensation layout according to one or more embodiments is adapted to work independently of the bias voltage applied to the Hall sensor.

One or more embodiments make it possible to compensate Hall sensitivity temperature drift by using a variable gain (for example a resistor-based variable gain loop) adapted to track also the Hall sensitivity drift variations due to corner variations.

While the layout exemplified in FIGS. 1 and 2 includes a differential sensing arrangement for example with the output signal $V_h$ from the Hall element H sensed as a voltage difference between two output terminals (possibly within the framework of a "spinning" arrangement, as conventional in the art of Hall sensors), the same underlying principles adopted for facilitating temperature stability may be applied to a non-differential layout, for example by using a compensation circuit 200 including a single feedback loop with one element H1 or R1 as discussed in the foregoing.

A circuit according to one or more embodiments may include:
an input port (for example 10) configured for receiving a sensing signal (for example $V_H$) from a Hall sensor (for example H),
an output port (for example 202a, 202b) configured for providing a compensated Hall sensing signal (for example $V_{out}$),
a compensation circuit (for example 20) between the input port and the output port, the compensation circuit having a gain inversely proportional to Hall sensor drift mobility, $\mu_n$, wherein the compensated sensing signal is temperature-compensated.

One or more embodiments may include a gain control input (for example 102) configured for receiving a temperature-dependent control signal (for example $V_{pwell}$), the gain of the compensation circuit controllable as a function of the control signal at the gain control input with said gain inversely proportional to the ratio, $r_n$, of the Hall sensor mobility, $\mu'_n$, to the Hall sensor drift mobility $\mu_n$.

In one or more embodiments the compensation circuit may include at least one gain-setting (for example feedback-loop) resistive element (for example H1, R1) having a resistance value (for example $R_{Hall1}$) inversely proportional to Hall sensor drift mobility, $\mu_n$, for example:

$$R_{Hall1} = \frac{1}{qN_D\mu_n} \frac{L}{Wt_1}.$$

In one or more embodiments, the resistive element may include a resistance control input (for example 102) configured for receiving said temperature-dependent control signal, the resistance value of the resistive element controllable as a function of the control signal at the resistance control input, for example:

$$V_{bias} A1 r_n \frac{1}{qN_D t_1 (V_{pwell})R} B$$

In one or more embodiments the resistive element may include a depletion region (for example D) in a first semiconductor well (for example 104, P-well) formed in a semiconductor well (for example 102, N-well) of opposed polarity (for example P-type v. N-type).

In one or more embodiments, the control signal at the resistance control input may be active on the thickness of said depletion region in said first well.

In one or more embodiments the resistive element may include a Hall element (for example H1).

One or more embodiments may include an amplifier circuit (for example 10) between the input port and the compensation circuit.

In one or more embodiments:
the input port may be configured for receiving a differential sensing signal from a Hall sensor,
the compensation circuit may include a differential circuit including a pair of gain-setting loops (H1, R; R1, R) wherein the output port includes two output nodes (for example 202a, 202b) each coupled to a respective one of the gain-setting loops, with the compensated sensing signal provided between the two output nodes.

In one or more embodiments a device may include:
a Hall sensor (for example H) providing a Hall sensing signal,
a circuit according to one or more embodiments, the circuit having the input port coupled to the Hall sensor (H) to receive the sensing signal from the Hall sensor (H).

In one or more embodiments the Hall sensor may be formed in an epitaxial layer of semiconductor material, wherein the compensation circuit includes at least one gain-setting resistive element formed in the same epitaxial layer of the Hall element.

In one or more embodiments a method may include:
receiving a sensing signal from a Hall sensor at an input port,
providing a compensated Hall sensing signal at an output port,
applying between the input port and the output port a compensation gain inversely proportional to Hall sensor drift mobility, $\mu_n$, wherein the compensated sensing signal ($V_{out}$) is temperature-compensated.

One or more embodiments may include:
receiving a temperature-dependent compensation gain control signal,
controlling the compensation gain as a function of the control signal by keeping the compensation gain inversely proportional to the ratio, $r_n$, of the Hall sensor mobility, $\mu'_n$, to the Hall sensor drift mobility $\mu_n$.

Without prejudice to the underlying principles, the details and embodiments may vary, even significantly, with respect to what has been described by way of example only, without departing from the extent of protection.

The extent of protection is defined by the annexed claims.

The claims are an integral part of the disclosure of embodiments as provided herein.

The invention claimed is:

1. A circuit, comprising:
   an input port configured to receive a Hall sensing signal;
   an output port configured to provide a compensated Hall sensing signal; and
   a compensation circuit coupled between the input port and the output port, wherein the compensation circuit has a gain that is inversely proportional to a Hall sensor drift mobility, $\mu_n$, and wherein the compensated Hall sensing signal is temperature-compensated;
   wherein the compensation circuit includes:
      a gain control input configured to receive a temperature-dependent control signal, wherein the gain of the compensation circuit is controllable as a function of the temperature-dependent control signal received at the gain control input; and
      at least one gain-setting resistive element having a resistance value inversely proportional to the Hall sensor drift mobility, $\mu_n$.

2. The circuit of claim 1, wherein the gain is inversely proportional to a ratio, $r_n$, of a Hall sensor mobility, $\mu'_n$, to the Hall sensor drift mobility $\mu_n$.

3. The circuit of claim 1, wherein the gain-setting resistive element includes a resistance control input configured to receive said temperature-dependent control signal, the resistance value of the gain-setting resistive element being controllable as a function of the temperature-dependent control signal at the resistance control input.

4. The circuit of claim 1, wherein the gain-setting resistive element includes a depletion region in a first semiconductor well formed in a semiconductor well of opposed polarity.

5. The circuit of claim 4, wherein the temperature-dependent control signal at the resistance control input is active to control a thickness of said depletion region.

6. The circuit of claim 1, wherein the gain-setting resistive element includes a Hall element.

7. The circuit of claim 1, further comprising an amplifier circuit having an input coupled to the input port and an output coupled to the compensation circuit.

8. The circuit of claim 1, further comprising a Hall sensor configured to generate said Hall sensing signal.

9. A circuit, comprising:
   an input port configured to receive a Hall sensing signal from a Hall sensor, wherein the Hall sensing signal is a differential sensing signal;
   an output port configured to provide a compensated Hall sensing signal; and
   a compensation circuit coupled between the input port and the output port, wherein the compensation circuit has a gain that is inversely proportional to a Hall sensor drift mobility, $\mu_n$, and wherein the compensated Hall sensing signal is temperature-compensated;
   wherein the compensation circuit includes a differential circuit including a pair of gain-setting loops, wherein the input port includes two input nodes and the output port includes two output nodes with each gain-setting loop of the gain-setting loops coupled between one of the input nodes and one of the output nodes, the compensated Hall sensing signal provided between the two output nodes.

10. The circuit of claim 9, wherein each gain-setting loop includes a Hall device configured to receive a temperature-dependent control signal.

11. The circuit of claim 10, wherein Hall device has at least one gain-setting resistive element having a resistance value inversely proportional to the Hall sensor drift mobility, said gain-setting resistive element including a resistance control input configured to receive said temperature-dependent control signal.

12. The circuit of claim 11, wherein the gain-setting resistive element includes a depletion region in a first semiconductor well formed in a semiconductor well of opposed polarity.

13. The circuit of claim 12, wherein the temperature-dependent control signal at the resistance control input is active to control a thickness of said depletion region.

14. The circuit of claim 9, wherein each gain-setting loop of the compensation circuit includes a gain control input configured to receive a temperature-dependent control signal, wherein the gain of the compensation circuit is controllable as a function of the temperature-dependent control signal received at the gain control input, said gain being inversely proportional to a ratio, $r_n$, of a Hall sensor mobility, $\mu'_n$, to the Hall sensor drift mobility $\mu_n$.

15. The circuit of claim 14, wherein each gain-setting loop of the compensation circuit includes at least one gain-setting resistive element coupled between said one of the input nodes and said none of the output nodes and having a resistance value inversely proportional to the Hall sensor drift mobility, $\mu_n$.

16. The circuit of claim 15, wherein the gain-setting resistive element includes a resistance control input configured to receive said temperature-dependent control signal, the resistance value of the gain-setting resistive element being controllable as a function of the temperature-dependent control signal at the resistance control input.

17. The circuit of claim 15, wherein the gain-setting resistive element includes a depletion region in a first semiconductor well formed in a semiconductor well of opposed polarity.

18. The circuit of claim 17, wherein the temperature-dependent control signal at the resistance control input is active to control a thickness of said depletion region.

19. The circuit of claim 15, wherein the gain-setting resistive element includes a Hall element.

20. The circuit of claim 9, further comprising an amplifier circuit between the input port and the compensation circuit.

21. A circuit, comprising:
   a Hall sensor configured to generate a Hall sensing signal, wherein said Hall sensor is formed in an epitaxial layer of semiconductor material;
   an input port configured to receive said Hall sensing signal;
   an output port configured to provide a compensated Hall sensing signal; and
   a compensation circuit coupled between the input port and the output port, wherein the compensation circuit has a gain that is inversely proportional to a Hall sensor drift mobility, $\mu_n$, and wherein the compensated Hall sensing signal is temperature-compensated,
   wherein the compensation circuit includes at least one gain-setting resistive element formed in the same epitaxial layer as the Hall sensor.

22. The circuit of claim 21, wherein the at least one gain-setting resistive element has a resistance value inversely proportional to the Hall sensor drift mobility, said gain-setting resistive element including a resistance control input configured to receive a temperature-dependent control signal.

23. The circuit of claim 22, wherein the gain-setting resistive element includes a depletion region in a first semiconductor well formed in a semiconductor well of opposed polarity.

24. The circuit of claim 23, wherein the temperature-dependent control signal at the resistance control input is active to control a thickness of said depletion region.

25. The circuit of claim 21, wherein the compensation circuit includes a gain control input configured to receive a temperature-dependent control signal, wherein the gain of the compensation circuit is controllable as a function of the temperature-dependent control signal received at the gain control input, said gain being inversely proportional to a ratio, $r_n$ of a Hall sensor mobility, $\mu'_n$, to the Hall sensor drift mobility $\mu_n$.

26. The circuit of claim 25, wherein the compensation circuit includes at least one gain-setting resistive element having a resistance value inversely proportional to the Hall sensor drift mobility, $\mu_n$.

27. The circuit of claim 26, wherein the gain-setting resistive element includes a resistance control input configured to receive said temperature-dependent control signal, the resistance value of the gain-setting resistive element being controllable as a function of the temperature-dependent control signal at the resistance control input.

28. The circuit of claim 26, wherein the gain-setting resistive element includes a depletion region in a first semiconductor well formed in a semiconductor well of opposed polarity.

29. The circuit of claim 28, wherein the temperature-dependent control signal at the resistance control input is active to control a thickness of said depletion region.

30. The circuit of claim 26, wherein the gain-setting resistive element includes a Hall element.

31. The circuit of claim 21, further comprising an amplifier circuit having an input coupled to the input port and an output coupled to the compensation circuit.

* * * * *